(12) United States Patent
Francis et al.

(10) Patent No.: US 7,956,419 B2
(45) Date of Patent: Jun. 7, 2011

(54) TRENCH IGBT WITH DEPLETION STOP LAYER

(75) Inventors: Richard Francis, Los Gatos, CA (US); Chiu Ng, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/265,489

(22) Filed: Nov. 2, 2005

(65) Prior Publication Data

US 2007/0096167 A1    May 3, 2007

(51) Int. Cl.
    *H01L 23/62*    (2006.01)
(52) U.S. Cl. .................... 257/362; 257/E29.063
(58) Field of Classification Search ........... 257/262, 257/362, E29.063
    See application file for complete search history.

(56) References Cited

U.S. PATENT DOCUMENTS

| | | | |
|---|---|---|---|
| 5,661,314 A | 8/1997 | Merrill et al. | |
| 5,795,793 A | 8/1998 | Kinzer | |
| 6,242,288 B1 | 6/2001 | Francis et al. | |
| 6,246,090 B1 * | 6/2001 | Brush et al. | 257/329 |
| 6,482,681 B1 * | 11/2002 | Francis et al. | 438/138 |
| 6,683,331 B2 | 1/2004 | Francis et al. | |
| 6,707,111 B2 | 3/2004 | Francis et al. | |
| 6,753,580 B1 | 6/2004 | Francis et al. | |

FOREIGN PATENT DOCUMENTS

| | | |
|---|---|---|
| JP | 2002-314083 | 10/2002 |
| JP | 2003-533047 | 11/2003 |

* cited by examiner

*Primary Examiner* — Bradley K Smith
*Assistant Examiner* — Amar Movva
(74) *Attorney, Agent, or Firm* — Farjami & Farjami LLP

(57) ABSTRACT

A very low $V_{CEON}$ non punch through trench IGBT built-in non-epitaxial float zone silicon has a depletion stop layer structure added to its bottom surface.

14 Claims, 5 Drawing Sheets

TRENCH IGBT WITH DEPLETION STOP LAYER

FIELD OF THE INVENTION

This invention relates to Insulated Gate Bipolar Transistors (IGBTs) and more specifically to a trench type IGBT having a depletion stop layer.

BACKGROUND OF THE INVENTION

Currently, there are two major types of IGBT devices: "punch through" and "non-punch through" devices. The "punch through" IGBT is normally fabricated on an epitaxial wafer, and "non punch-through" IGBTs on float zone (FZ) wafers. Typical epitaxial wafers used for IGBT manufacturing consist of two epitaxially deposited layers on an underlying substrate, a lightly doped top layer on top of a higher concentration buffer layer, on a substrate of opposite dopant type.

The buffer layer in the punch-through IGBT plays an important role in the performance of the device. It acts as a depletion stop layer under reverse bias and controls the injection efficiency of the backside anode in the forward conduction mode. The thickness and concentration of the buffer layer will affect the breakdown, forward conduction and the switching characteristics of the device. In general, the punch-through IGBT will have a better conduction ($V_{CEON}$) and switching tradeoff than a non punch-through IGBT device for a given technology or manufacturing process. However, epitaxial wafers are more expensive than Float Zone wafers. For higher voltage devices (>600V), it becomes difficult to control the epitaxial layer (epi) resistivity and thickness uniformity.

As described in U.S. Pat. No. 6,707,111, a punch-through IGBT can be formed in a thin FZ wafers with a proton implant to create an $N^+$ buffer layer.

It is also well known that IGBTs with a trench topology can be formed as described in U.S. Pat. No. 6,683,331, and will provide a lower on-state loss compared to a planar cellular or stripe topology.

The well-known figure of merit (FOM) for IGBTs is the trade-off between the conduction losses ($V_{CEON}$) and the turn-off energy due to minority carrier recombination (tail current). This tail current increases the turn-off energy ($E_{OFF}$). Any attempt to reduce the tail current amplitude and duration increases the forward voltage drop ($V_{CEON}$) of the IGBT. Thus, trade-offs adjust IGBTs for different application requirements. PT IGBTs are available with various trade-offs to suit a wide variety of applications (speeds). NPT IGBTs have a low $E_{OFF}$ compared to that of PT IGBTs but, suffer from high $V_{CEON}$, making them suitable for applications with switching frequencies >10 kHz.

It would be desirable to have an IGBT which has both lower $V_{CEON}$ and $E_{OFF}$ compared to the PT and NPT IGBTs and lower losses across a wide switching frequency range (4 kHz to 30 kHz). It would also be desirable to have an IGBT which can provide improved efficiency in a wide variety of applications with hard switching methods (low $V_{CEON}$ and $E_{OFF}$) and also with resonant switching methods (low $V_{CEON}$).

BRIEF DESCRIPTION OF THE INVENTION

This invention relates to a novel depletion stop IGBT with trench topology made in a float zone wafers and with both $V_{CEON}$ and $E_{OFF}$ lower then those of prior IGBT devices.

A typical trench IGBT, its structure and manufacturing process, as described in U.S. Pat. No. 6,683,331 is fabricated in a float zone wafer. For the 600V device, a resistivity of 22-30 ohm-cm can be used and to 50-80 ohm-cm for 1200V. After the front side structures are patterned and passivated, the wafer is thinned to 60-70 um for a 600V voltage device and 100-140 um for a 1200V device. An $N^+$ depletion stop layer is then formed on the backside of the wafer followed by a weak anode, also formed on the backside of the wafer, as described in U.S. Pat. No. 6,707,111.

The combination of trench topology and non-epi depletion stop technology offers superior $V_{CEON}$ vs. switching energy tradeoff as shown in FIG. 1. Compared to a planar punch-through IGBT, the novel depletion-stop trench IGBT provides a much improved switching energy loss. Compared to the planar NPT IGBT, the novel depletion stop trench IGBT has a much lower conduction loss for the same switching energy loss.

DETAILED DESCRIPTION OF THE DRAWINGS (a) Prior Art IGBTS

Figure 2:
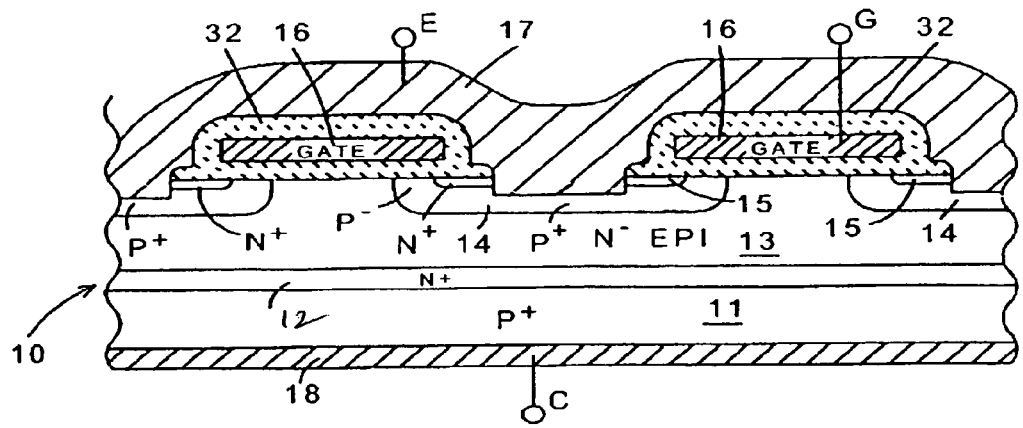
FIG. 2 is a cross-sectional view of a few cells in a typical prior art punch through IGBT.

FIG. 2 shows a prior art punch through planar IGBT which is described in our U.S. Pat. No. 6,707,111, the full disclosure of which is incorporated herein by reference.

Referring to FIG. 2, there is shown a small portion of an IGBT die which is formed in a wafer containing a plurality of simultaneously formed identical die. The terms die and wafer are used interchangeably herein. The device and process for its manufacture are well known, and U.S. Pat. Nos. 5,661,314 and 5,795,793 describe typical devices and manufacturing processes. In general, the device is formed in a monocrystalline silicon wafer 10 which has a conventional float zone material $P^+$ body 11 which has an $N^+$ epitaxially deposited layer 12 thereon and a further N epitaxially deposited layer 13 in which junctions are formed. A conventional D-MOS junction pattern is formed in the top surface of epitaxial layer 13 and consists of a plurality of spaced P type bases or channel regions 14 each containing an annular source 15. Other topologies can be used for the bases 15.

A conductive polysilicon gate lattice 16 then overlies a conventional gate oxide and the invertible channel region between the exterior of source regions 14. An emitter electrode 17 is then formed over the top surface of wafer 10 and is insulated from gate lattice 16 but contacts the base and source regions 14 and 15. A collector electrode 18 contacts the bottom of region 11.

The N+ buffer layer 12 has a thickness and concentration to obtain the desired switching and breakdown characteristics of the device. The N+ buffer 12 controls the injection efficiency of the bipolar transistor 11/12/13. The thickness of the wafer, with P+ substrate 11 permits manufacture without danger of wafer breakage. However, the epi wafer 10 is expensive.

Figure 1:
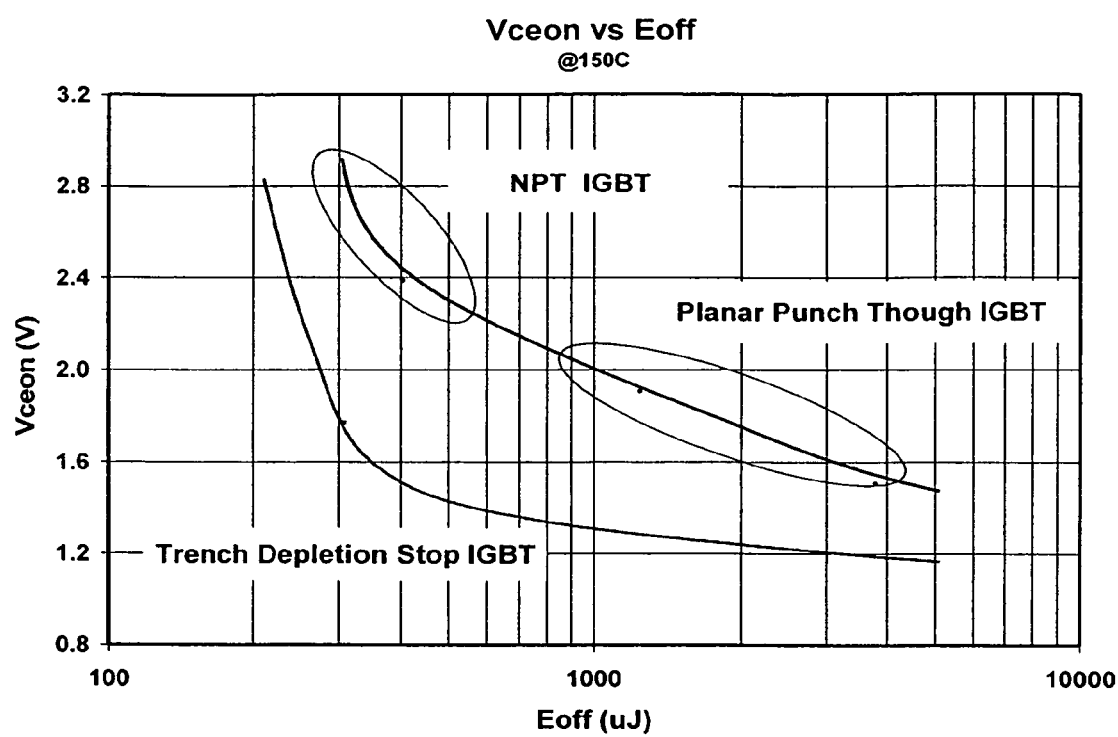
FIG. 1 shows values of $V_{CEON}$ versus switching energy $E_{OFF}$ for non-punch through trench IGBTs, planar punch-through IGBTs and the trench depletion stop IGBT of the invention.
Figure 3:
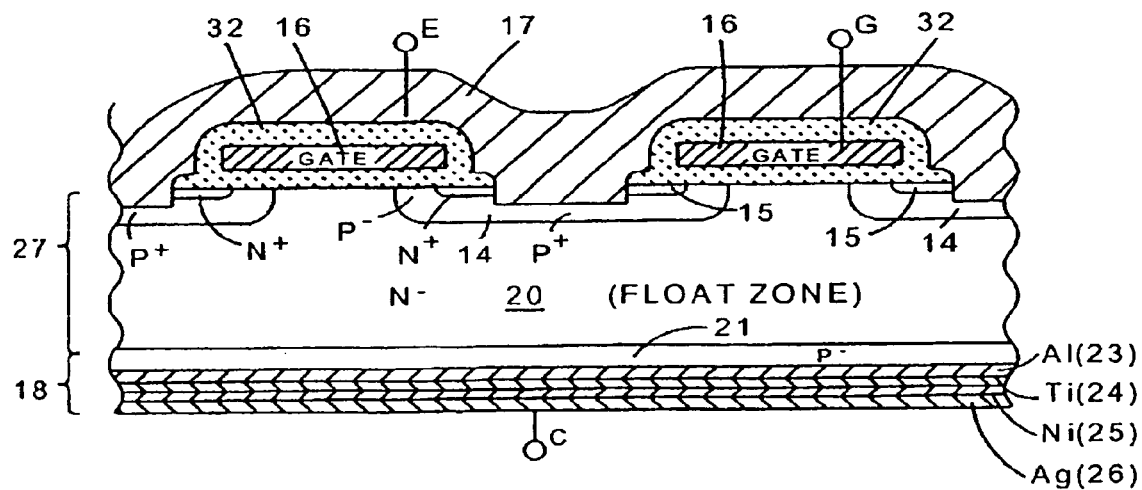
FIG. 3 is a cross-sectional view of a few cells of a typical prior art non-punch through IGBT with an ultra-thin wafer.

In order to avoid the higher cost of wafers with epitaxially deposited layers, it is known that the DMOS pattern of FIG. 1 can be formed in the surface of less expensive float zone material, as shown in FIG. 3. In the device of FIG. 3, the DMOS top pattern, and the top metal and passivation is formed in a relatively thick N-float zone (FZ) wafer 20 which can be processed without breakage. The bottom surface is then ground and etched to reduce the body thickness 27 to a value dependent on the desired breakdown voltage. A weak P− collector region 21 is then formed and is contacted by a collector electrode 18 consisting of an aluminum layer 23, covered in turn by titanium layer 24, nickel-vanadium layer 25 and silver layer 26. Other metals can be used. The body 27 of the wafer 20 is N− float zone silicon and it receives the D-MOS junction pattern of FIG. 1 in its top surface.

The P− weak anode 21 may be implanted or may be an amorphous silicon layer. Such devices are described in U.S. Pat. No. 6,753,580, issued Jun. 22, 2004; and U.S. Pat. No. 6,242,288, issued Jun. 5, 2001.

The device of FIG. 3 operates in a non-punch through mode of operation. That is, the electric field across the silicon reaches zero before it reaches the bottom of the wafer or die. The P type concentration of base diffusion 14 reduces at its junction with N− body 27 (typically 25 ohm cm for a 600 volt device) and the P− weak anode is very shallow, for example, 0.1 to 0.5 microns. The thickness of body 27 is highly dependent on breakdown voltage. Thus, body 27 is about 80 microns for a 600 volt device and would be about 250 microns for a 1700 volt breakdown. The electric field across the device reduces to zero before reaching collector 22. Thus, the field does not punch through.

Figure 4:
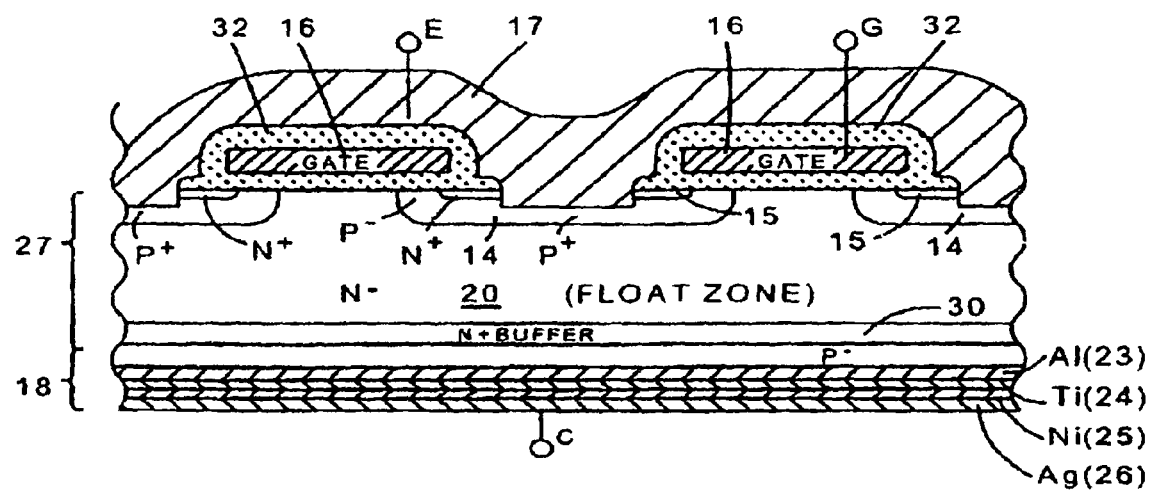
FIG. 4 is a cross-sectional view of a few cells of an IGBT formed in an ultra-thin wafer, and having a buffer layer to define a prior art punch through type device as in U.S. Pat. No. 6,707,111.

The device of FIG. 3 can be made to function as a punch through device by adding a buffer zone N+ implant 30 as shown in FIG. 4. Components in FIG. 4 which are similar to those of FIG. 3 have the same identifying numerals. The concentration profile for the device of FIG. 4 is such that the electric field across body 27 reaches the highly conductive buffer 30 and therefore punches through across the wafer in reverse bias.

The conventional way of forming N+ buffer 30 is by the implant of phosphorus or arsenic atoms into the back of the wafer after the thinning operation, followed by an activation anneal to activate the dopant. These implants require an implant energy of 600 keV to 2 MeV to reach the desired N+ region depth. This requires an expensive high energy implanter, and added handling of the fragile wafer. Further, the anneal temperature must be kept below the deposition temperature of the top surface passivation layers (350° C. to 425° C.). However, the preferred anneal temperature of phosphorus or arsenic is above about 700° C. Since a lower temperature must be used, only a small portion of the N+ implant dopant 30 will be annealed and the amount of the anneal varies greatly with small temperature change.

The N+ region 30 of FIG. 4 is preferably formed by a hydrogen implant which can be carried out with a lower implant energy and with a reduced activation temperature which is well below the temperature which will damage the passivation on the top side of the device.

Thus, hydrogen ions can be implanted with an energy in the range of 100 to 500 KeV at doses in the range of 1E12/cm$^2$ to 1E16/cm$^2$. Good results have been obtained using an energy of 170 KeV at specific doses of 5E13/cm$^2$ to 5E14/cm$^2$ of hydrogen ions.

The wafer is then annealed in a forming gas for 30 to 60 minutes at 300° C. to 400° C., followed by a P− ion implant, or by a P doped amorphous silicon layer deposited by PECVD or by sputtering. A contact is next formed by sputtering of the following metals, in sequence: pure aluminum (1000 Å); titanium (1000 Å); nickel-vanadium (7% V) (4000 Å); silver (6000 Å). An in-situ annealing process prior to aluminum deposition drives off any residual moisture from the wafer surface and ensures good contact between the aluminum and the silicon.

As pointed out previously, trench type IGBTs are also well known, such as the devices shown in our U.S. Pat. No. 6,683,331, the full disclosure of which is incorporated herein by reference.

Figure 5:
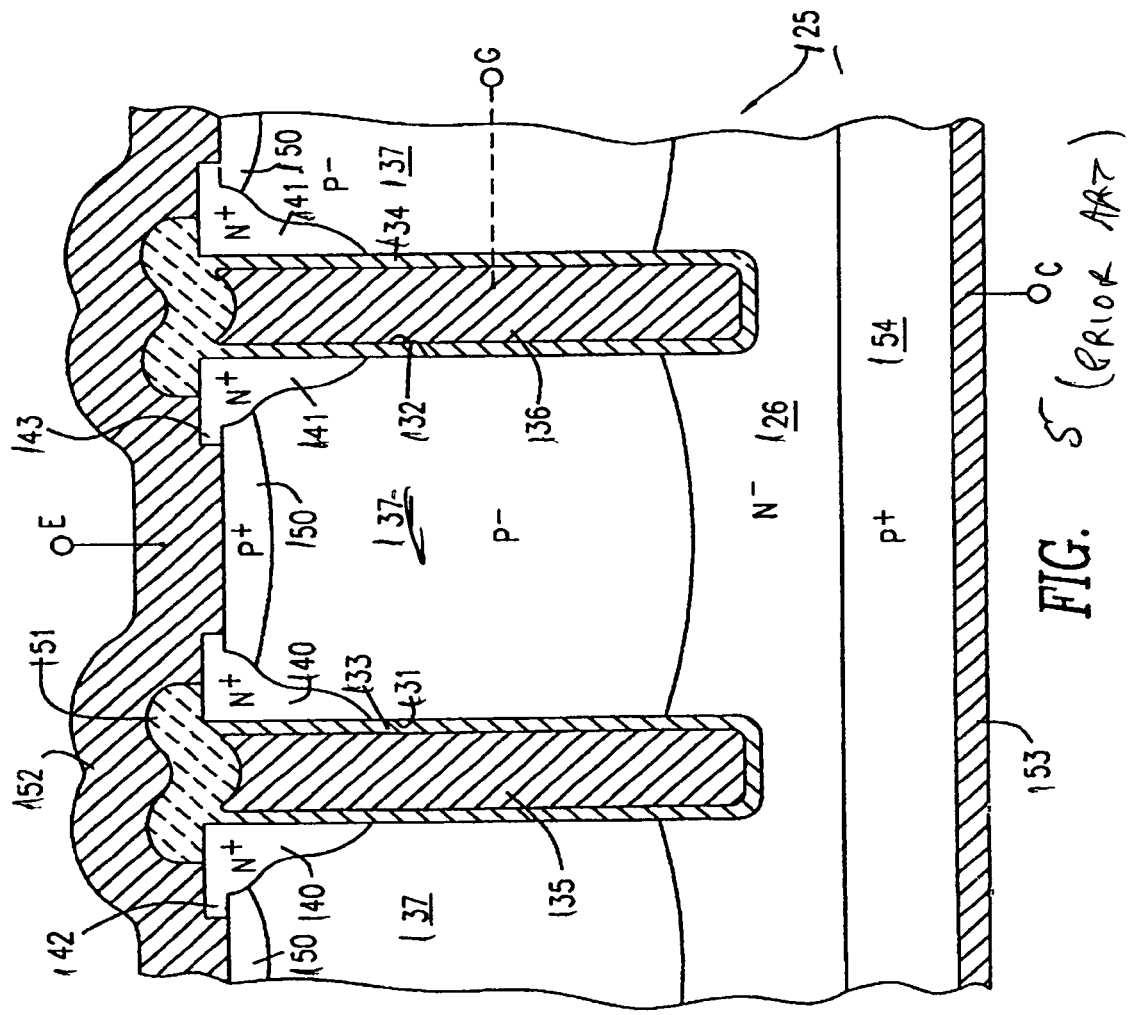
FIG. 5 is a cross-sectional through two adjacent trenches of a non-punch through IGBT trench die.

FIG. 5 shows a pair of adjacent "cells" (which may be elongated stripes or spaced polygonal elements) in the active area of a device formed in accordance with the invention. The cells are two of up to many thousands in a single die, and are formed with the die in the wafer stage.

The structure of FIG. 5 is formed in a common starting wafer 125 of float zone material. However, epitaxial wafers can also be used. The wafer 125 has an N− body which receives adjacent deep trenches 131 and 132 which are lined with thin (for example 1000 Å) silicon dioxide gate insulation layers 133, 134 respectively and are filled with conductive polysilicon gates 135 and 136 respectively which are interconnected (not shown) and have an external gate terminal G, schematically shown. Trenches 131 and 132 may be about 1.5 microns wide, spaced by about 5 to 10 microns and may have a depth of 4 to 9 microns, and preferably about 6.5 microns. These extend through a P− base diffusion 137 which, at the trench region, is about 5 microns deep (as measured from the top surface of the silicon) for an 8 micron deep trench.

Trenches 131 and 132 extend through N+ emitter regions 140 and 141 respectively which are very deep (2 microns to 4 microns) and have a very short lateral extension, for example (1.5 microns to 3 microns). Note that emitter regions 140 and 141 which have shallow shelf contact regions 142 and 143 respectively, which have a lateral extension of about 0.2 microns to 0.5 microns.

A P+ contact region 150 extends into P− base 37 and between emitter regions 140 and 141. The polysilicon gates 135 and 136 are covered by a suitable insulation oxide 151 and the top surface of the device receives an aluminum or other suitable emitter contact 152. The backside of the device contains a P+ diffusion 154 which receives collector contact 153.

The use of the very deep trench (6.5 microns) and very deep P− base 37 (7 microns) permits the use of the very deep, but narrow emitter regions 140 and 141 while still leaving a sufficiently long invertible channel below the emitter regions (for example, 2 microns) to permit the P regions 137 to support a reasonable voltage and so that the N− body 126 can be optimized. Further, when the device operates in avalanche, a hole current flows from P+ region 154 and up and under the emitters 140 and 141 and through the effective resistance $R_B$, under the very narrow emitter regions 140 and 141. This resistance is very low to avoid the turn on of the NPN transistor 140, 137, 126, for example, and to avoid latching on the IGBT structure.

(b) The Trench IGBTS of the Invention

Figure 6:
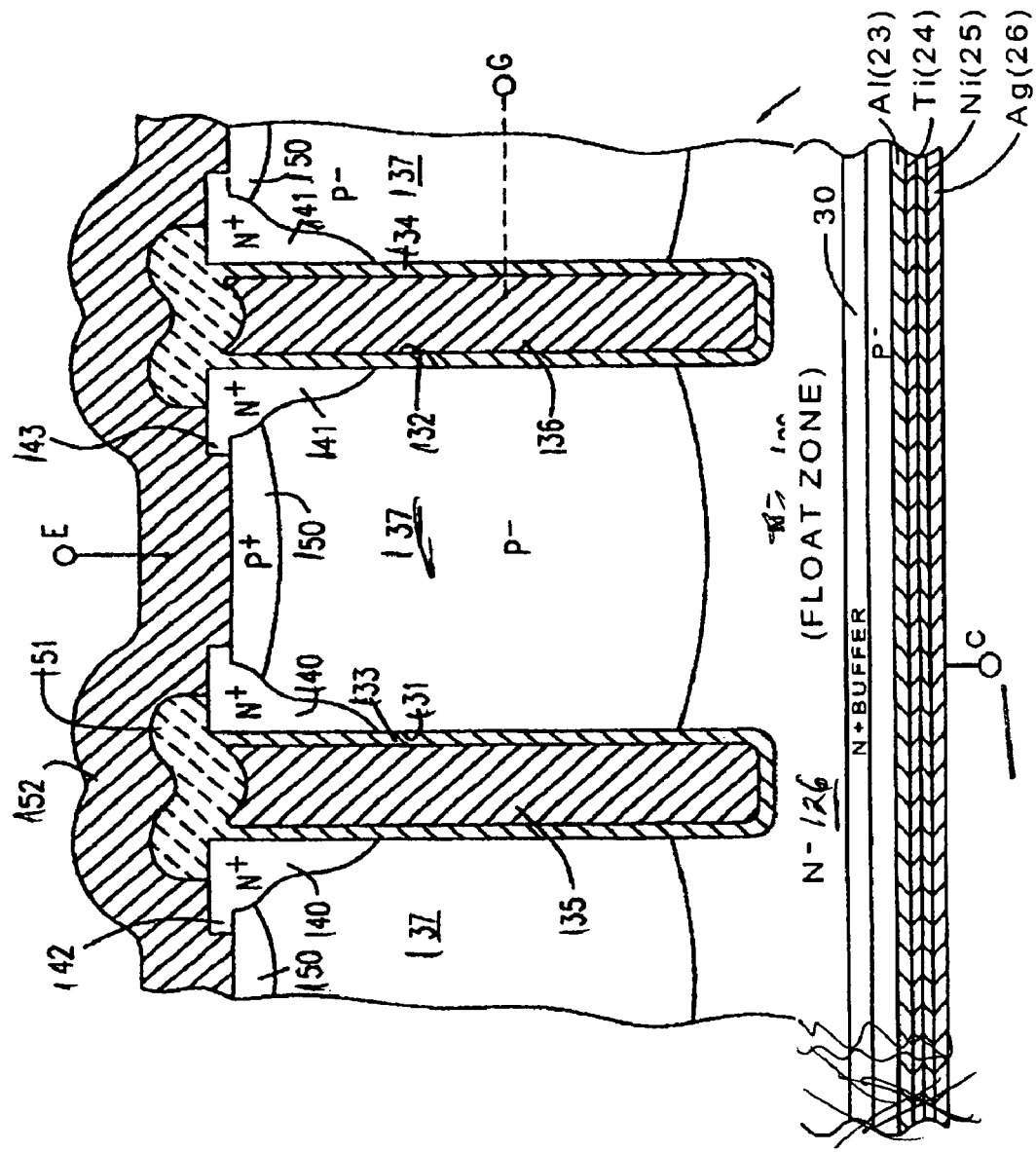
FIG. 6 is a cross-section like that of FIG. 5, but with the depletion stop layer of the invention.

FIG. 6 shows a cross-section of an IGBT constructed in accordance with the invention. The reference numerals in FIG. 6 which are the same as those of FIGS. 2 through 5 identifying identical elements.

In accordance with the invention, the N⁻ region 126 of FIG. 5 is etched back, for example to a thickness of less than 150 microns as described in FIG. 4, and the N type buffer 30 and P⁻ anode region and its related collector contact are added to the ground-back layer. This results in a novel trench type device with a non-epitaxial depletion stop structure. The characteristics of the resulting device are shown in FIG. 1, and they exhibit greatly improved $V_{CEON}$ v. $E_{OFF}$ characteristics as compared to the known NPT IGBT and planar PT IGBTs of FIGS. 2, 3, 4 and 5. Thus, the trench IGBT of the invention provides improved efficiency in a wide variety of applications with hard switching (low $V_{CEON}$ and low $E_{OFF}$) and are applicable to resonant switching circuits because of the low $V_{CEON}$.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A punch through trench type IGBT device, comprising:
   an N type wafer float zone silicon, the N type wafer having top and bottom surfaces and a thickness;
   a MOSgated junction pattern formed on the top surface of the N type wafer;
   at least one metal layer arranged on the top surface of the N type wafer;
   a non-epitaxial depletion stop N⁺ buffer zone that is less than 150 microns thick having a top surface and a bottom surface;
   a P type weak anode arranged adjacent to the bottom surface of the N⁺ buffer zone; and
   a backside metal contact connected to the P type weak anode, wherein the thickness of the N type wafer float zone silicon is between 60 um and 140 um, the breakdown voltage of the punch through trench type IGBT being approximately 600V at 60 um thickness.

2. The IGBT device of claim 1, wherein the backside metal contact includes an aluminum layer, a titanium layer arranged adjacent to the aluminum layer, a nickel-vanadium layer arranged adjacent to the titanium layer, and a silver layer arranged adjacent to the nickel-vanadium layer.

3. The IGBT device of claim 1, wherein said N⁺ buffer zone includes implanted hydrogen.

4. The IGBT device of claim 1, wherein the breakdown voltage of the punch through IGBT is 1200V at 140 um thickness N type wafer float zone silicon.

5. The IGBT device of claim 4, wherein at said 140 um thickness, said N type wafer float zone silicon has a resistivity of 50-80 ohm-cm.

6. The IGBT device of claim 1, wherein at said 60 um thickness, said N type wafer float zone silicon has a resistivity of 22-30 ohm-cm.

7. A punch through trench type IGBT device, comprising:
   an N type wafer float zone silicon thicker than 60 um and thinner than 140 um, the N type wafer having top and bottom surfaces;
   a MOSgated junction pattern that includes a plurality of gate trenches through a P type base region formed on the top surface of the N type wafer;
   at least one metal layer arranged on the top surface of the N type wafer;
   a depletion stop N⁺ buffer zone formed adjacent the bottom surface of said wafer; and
   a backside metal contact connected to the P type weak anode;
   said trench type punch through IGBT requiring $E_{off}$ values of less than 700 uJ while concurrently capable of achieving $V_{CEON}$ values between 1.5 volts and 2.0 volts.

8. The IGBT device of claim 7, wherein the MOSgated junction pattern includes a plurality of gate trenches through a P type base region formed in the N type wafer.

9. The IGBT device of claim 7, wherein the backside metal contact includes an aluminum layer, a titanium layer arranged adjacent to the aluminum layer, a nickel-vanadium layer arranged adjacent to the titanium layer, and a silver layer arranged adjacent to the nickel-vanadium layer.

10. The IGBT device of claim 7, wherein the MOSgated junction pattern further comprises:
    at least two spaced trenches extending into the upper surface of a chip of semiconductor material, said trenches having interior vertical surfaces which are lined with a gate insulation and which are filled with conductive gate material, said trenches extending through a channel diffusion region of a first conductivity type for a given portion of their length;
    a plurality of emitter diffusion regions of the other of the conductivity type extending into said chip from the top of said channel diffusion region and adjacent to said trenches from the top of said chip and for a given depth as measured along the vertical surfaces of said trenches,
    a contact surface spacing adjacent respective ones of said two spaced trenches, said contact surface being interposed between adjacent ones of said emitter diffusions which extend toward one another in the channel space between adjacent trenches.

11. The IGBT device of claim 10, wherein the emitter regions have a lateral width at the top of the channel diffusion region, the emitter regions having geometry whereby their depth from the top of said chip is greater than their said lateral width.

12. The IGBT device of claim 10, wherein the thickness of the N type wafer float zone silicon comprises a reduced thickness.

13. The IGBT device of claim 7, said IGBT device configured as part of a resonant switching circuit.

14. The IGBT device of claim 7, wherein said N⁺ buffer zone includes implanted hydrogen.

* * * * *